(12) United States Patent
Rogers

(10) Patent No.: US 8,522,493 B1
(45) Date of Patent: Sep. 3, 2013

(54) SOLAR-POWER ROOF COMPONENTS AND SYSTEMS, AND METHOD OF MANUFACTURING SAME

(76) Inventor: Randy William Rogers, Victoria (CA)

( * ) Notice: Subject to any disclaimer, the term of this patent is extended or adjusted under 35 U.S.C. 154(b) by 0 days.

(21) Appl. No.: 13/597,846

(22) Filed: Aug. 29, 2012

Related U.S. Application Data

(63) Continuation of application No. 13/492,023, filed on Jun. 8, 2012, now abandoned.

(60) Provisional application No. 61/495,092, filed on Jun. 9, 2011.

(51) Int. Cl.
*E04D 13/18* (2006.01)

(52) U.S. Cl.
USPC ...................................................... 52/173.3

(58) Field of Classification Search
USPC ................. 52/22, 173.3, 586.1, 586.2, 582.1, 52/656.1, 665
See application file for complete search history.

(56) References Cited

U.S. PATENT DOCUMENTS

| | | | |
|---|---|---|---|
| 3,352,070 A * | 11/1967 | Raynes | 52/22 |
| 6,182,403 B1 * | 2/2001 | Mimura et al. | 52/173.3 |
| 6,311,436 B1 | 11/2001 | Mimura et al. | |
| 7,406,800 B2 * | 8/2008 | Cinnamon et al. | 52/173.3 |
| 7,506,477 B2 | 3/2009 | Flaherty et al. | |
| 7,642,449 B2 | 1/2010 | Korman et al. | |
| 7,678,991 B2 | 3/2010 | McKaskill et al. | |
| 7,681,363 B2 | 3/2010 | Baniste | |
| 7,705,235 B2 | 4/2010 | Bilyalov et al. | |
| 7,819,114 B2 * | 10/2010 | Augenbraun et al. | 126/623 |
| 2007/0251571 A1 * | 11/2007 | Jacobs et al. | 136/256 |
| 2008/0053517 A1 * | 3/2008 | Plaisted et al. | 136/251 |
| 2008/0098672 A1 * | 5/2008 | O'Hagin et al. | 52/173.3 |
| 2009/0126782 A1 * | 5/2009 | Krause et al. | 136/251 |
| 2009/0159118 A1 * | 6/2009 | Kalkanoglu et al. | 136/251 |
| 2010/0275534 A1 * | 11/2010 | Ruskin et al. | 52/173.3 |
| 2011/0214375 A1 * | 9/2011 | Gaudreau | 52/311.1 |
| 2012/0260588 A1 * | 10/2012 | Allen | 52/173.3 |

FOREIGN PATENT DOCUMENTS

CA 2238747 4/1998

OTHER PUBLICATIONS

Eagle Solar, "Eagle Solar Roofs with SolarBlend from Suntech", http:llwww.eagleroofing.comlpdflProductLiturature|RegionalBrochures|Eagle-Solar-Roof-Brochure.pdf (Aug. 2010).
Luma Resources, LRSS "High Efficiency Polycrystalline Building Integrated Photovoltaic Solar Shingle", http://www.lumaresources.com/datasheets/lrss.pdf, (May 2010).
Powerhouse™ DOW Solar, "The hardworking Solar Shingle that protects your home and powers your life", http://www.dowsolar.com/pdfs/solar-pamphlet.pdf, (Mar. 2010).
Sole Power Tile™, "Solar driven by design", http://www.ustile.com/Resources/DocumentsISPT001(1 ).pdf, (Dec. 2010).

* cited by examiner

*Primary Examiner* — Mark Wendell
*Assistant Examiner* — Keith Minter
(74) *Attorney, Agent, or Firm* — Klarquist Sparkman, LLP

(57) ABSTRACT

A solar-power roof component including a sheet metal panel preferably configured for installation adjacent non-solar metal roofing, the sheet metal panel having a recess containing an array of solar cells encapsulated in a two-layer encapsulant made up of a bottom darker tinted layer and a top less tinted layer. The upper surface of the sheet metal panel and the encapsulant preferably have ridges and grooves configured to mimic surface texture of wood shakes and the gaps between such shakes.

8 Claims, 5 Drawing Sheets

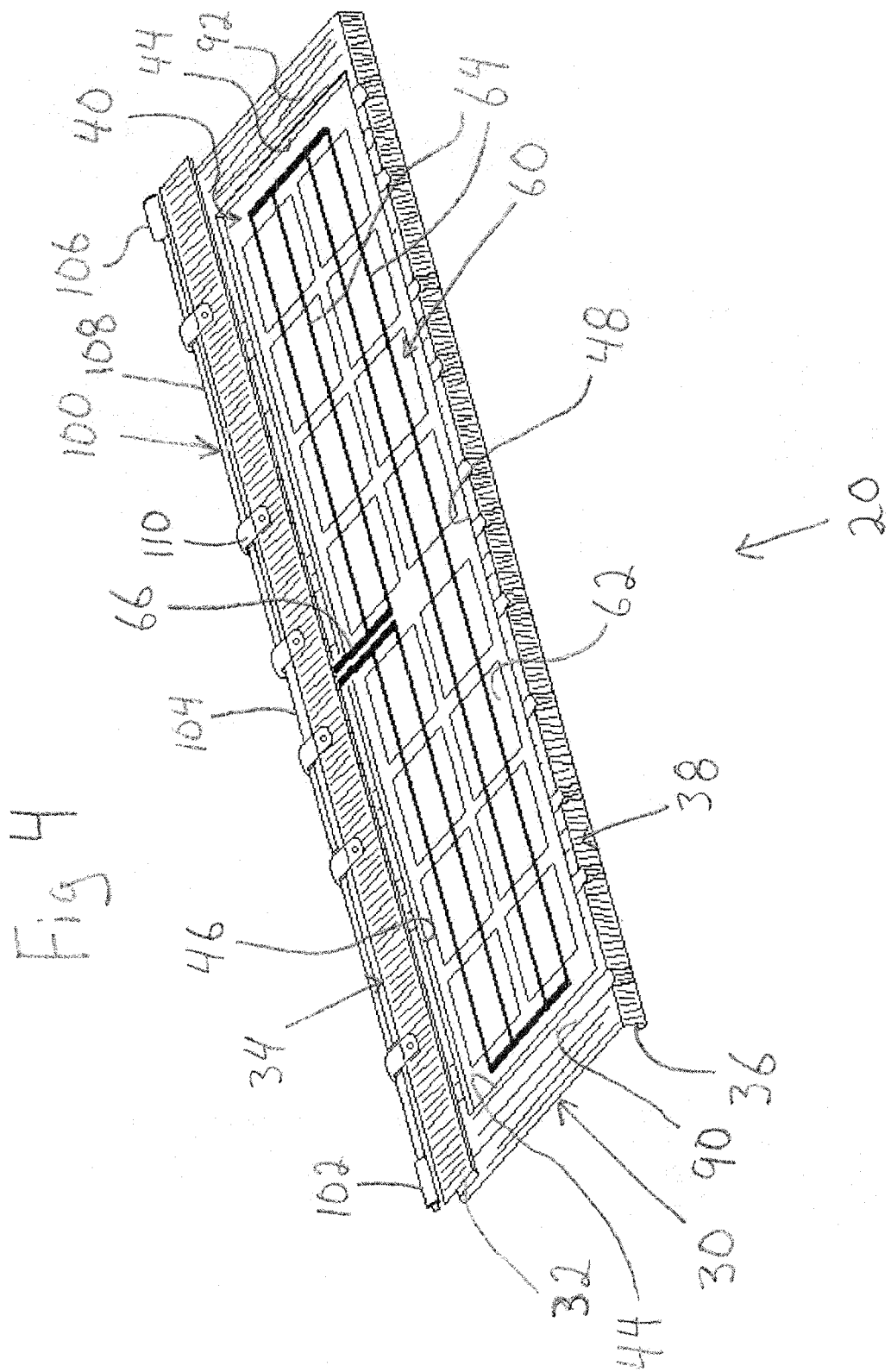

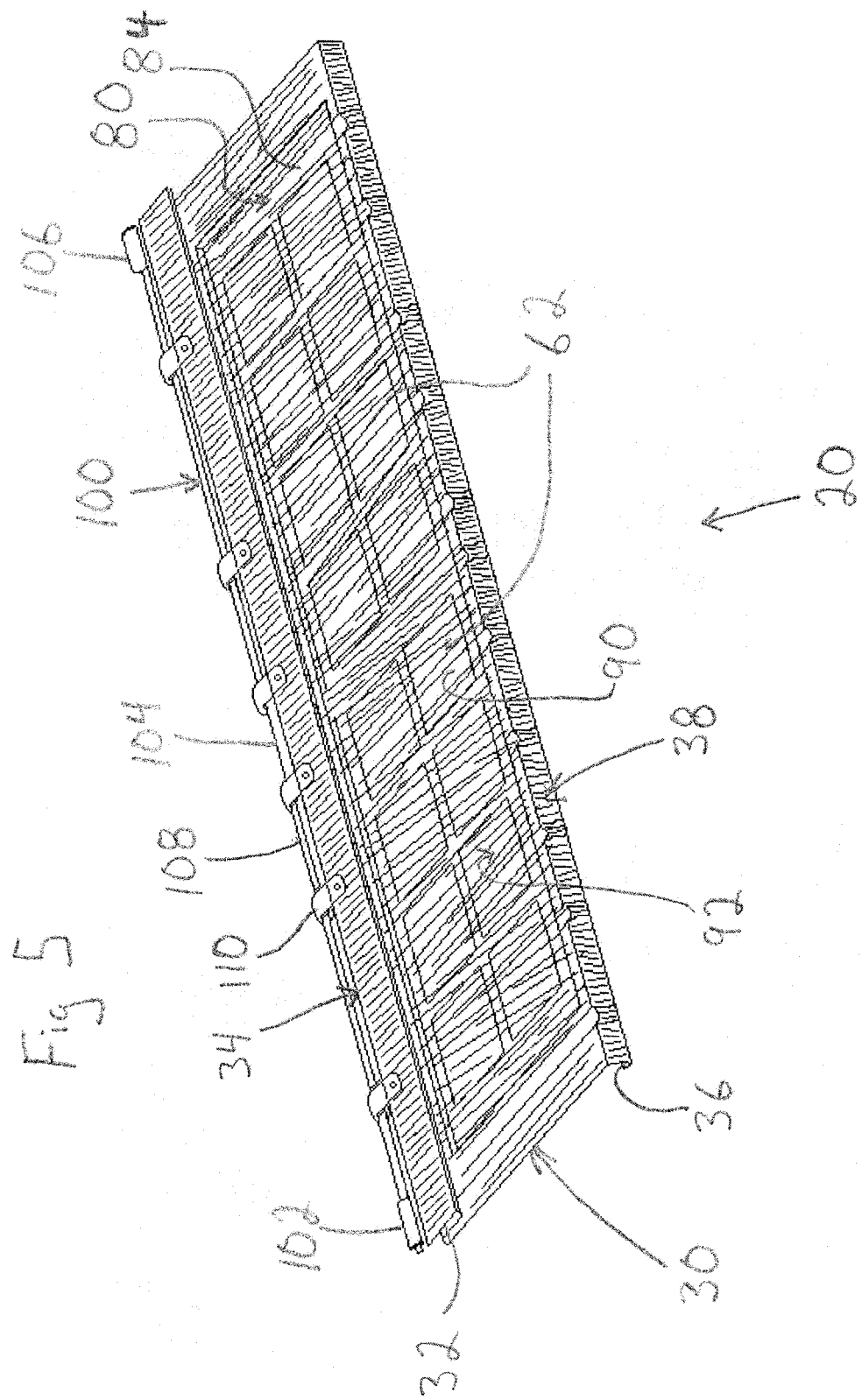

SOLAR-POWER ROOF COMPONENTS AND SYSTEMS, AND METHOD OF MANUFACTURING SAME

CROSS REFERENCE TO RELATED APPLICATIONS

This application is a continuation of U.S. application Ser. No. 13/492,023, filed 8 Jun. 2012 now abandoned, which claims the benefit of U.S. Provisional Application No. 61/495,092, filed 9 Jun. 2011, which is incorporated herein in its entirety.

FIELD OF THE INVENTION

This invention relates to the use of photovoltaic cells on buildings for the generation of electricity, and in particular, to roofing panels for use on sloped roofs and having integral photovoltaic cells, and methods for manufacturing same.

BACKGROUND OF THE INVENTION

Metal roofing panels for use on sloped roofs, with edges configured for interlocking when installed and appearances similar to conventional wood shakes, ceramic tile and slate, are known.

Roof mounted photovoltaic systems are also known, for example as discussed in the following patent documents: CA2238747—PHOTOVOLTAIC SOLAR ROOF; U.S. Pat. No. 6,311,436—SOLAR ROOF MEMBER; U.S. Pat. No. 7,705,235—PHOTOVOLTAIC DEVICE; U.S. Pat. No. 7,681,363—ELECTRIC TILE MODULES; U.S. Pat. No. 7,678,991—RIGID INTEGRATED PHOTOVOLTAIC ROOFING MEMBRANE AND RELATED METHODS OF MANUFACTURING SAME; U.S. Pat. No. 7,642,449—PHOTOVOLTAIC INTEGRATED BUILDING COMPONENT; and U.S. Pat. No. 7,506,477—PROFILE ROOF TILE WITH INTEGRATED PHOTOVOLTAIC MODULE.

SUMMARY OF THE INVENTION

In one aspect, the invention provides a formed sheet metal roof panel with solar cells in an encapsulant fixed in a recess on the sun exposed upper surface of the panel and having interconnecting electrical wiring fixed to the (non sun exposed) underside of the panel suitable for ready interlocking electrical connection with other such panels.
  Useful attributes of the present invention are as follows:
  The visual appeal of the roof panel and how the presence of solar cells within the roof panel is nearly undetectable.
  The use of a tinted liquid polymer encapsulant that is not only the sole encapsulant used (entirely surrounding the solar cells, front and back), but also that it is used as the exterior exposed surface of the panel—significantly reducing manufacturing processes and significantly reducing common potential failure of panels due to moisture penetration.
  The application of a surface imprint mould to make the exposed surface of the panel/encapsulant show design details, be uneven and create texturization. This is done for visual appeal and to significantly boost the electrical output of the cells (increase efficiency).

In another aspect, the invention provides a solar roof component for use on a sloped roof, the component including: a sheet metal roof panel having an upper edge and a lower edge configured for interlocking with other similar panels, and having a panel top surface and a recess in the top surface having a recess bottom; one or more solar cells located in the recess and encapsulated in a light transmitting encapsulant affixed to the recess wherein the encapsulant top surface generally aligns with the panel top surface; and a wiring assembly, connected to the array of solar cells and comprising a first electrical connector and a second electrical connector, the first electrical connector configured to electrically connect with a connector similar to the second connector on another similar solar roof component, and the second electrical connector configured to electrically connect with a connector similar to the first connector on still another similar roof component; wherein, a plurality of such solar roof components are installable on a roof in an electrically interconnected manner.

The panel top surface and encapsulant top surface may be shaped to mimic wood shingles. The panel top surface and encapsulant top surface may have channels extending generally between the upper edge and the lower edge in appearance mimicking the gaps between adjacent wood shingles, and ridges and grooves extending generally between the upper edge and the lower edge in appearance mimicking the surface texture of a wood shingle.

The encapsulant may be a UV-resistant optically clear plastic. The plastic may be a urethane casting resin.

The recess bottom may be generally planar and the solar roof component may further include a barrier sheet interposed between the recess bottom and the one or more solar cells. The barrier sheet may be a non-woven glass fiber mat.

The encapsulant may consist of two layers: a darker tinted layer overlying the recess bottom and substantially encapsulating the barrier sheet, and a less tinted layer overlying the darker tinted layer and substantially encapsulating the one or more solar cells.

The one or more solar cells may be a photovoltaic array comprising sixteen crystalline solar cells and wires electrically interconnecting the solar cells in series.

The upper edge may have an S-lock configuration and the lower edge may have a bottom lip configured for engaging the S-Lock of the upper edge of a similar adjacent panel so as to form a water shedding interlocking joint between the solar roof component and the adjacent panel.

The roof panel may be coated with an oven-cured, fluoropolymer surface protector.

In another aspect the present invention provides a method for manufacturing a solar roof component including the steps of: obtaining a pre-coated sheet metal panel; press forming the sheet metal panel to create a recess, channels and wood grain texture; creating a wiring hole in the recess; creating an S-lock configuration defining an upper edge of the panel and a bottom lip defining a lower edge of the panel; etching the pre-coating within the recess; positioning a barrier sheet within the recess; pouring a sufficient amount of a darker tinted liquid polymer into the recess to substantially saturate and cover the barrier sheet; positioning one or more solar cells in the recess above the barrier sheet; inserting connection wires connected to the one or more solar cells through the wire hole; pouring a sufficient amount of a less tinted liquid polymer into the recess, so as to bring the top of the less tinted liquid polymer to the vicinity of the level of the top of the adjacent portions of the panel thus covering and encapsulating the one or more solar cells; shaping the surface of the less tinted liquid polymer so as to create the channels and wood grain texture on the top surface of the less tinted liquid polymer generally conforming to the channels and wood grain texture press formed in the panel; and connecting the connection wires to a wiring assembly configured for interconnecting the solar roof component with other similar solar roof components and securing the wiring assembly to the panel.

The panel pre-coating may include an oven-cured, fluoropolymer surface protector. The step of etching the pre-coating within the recess may include sand blasting. The barrier sheet may consist of a non-woven glass fiber mat. The darker tinted liquid polymer and less tinted liquid polymer may each include a UV-resistant optically clear plastic. The step of shaping the surface of the less tinted liquid polymer may include applying a reverse imprint mould to the surface of the less tinted polymer and removing the mould once the less tinted polymer has sufficiently cured to retain the channels and wood grain texture.

In another aspect, the present invention provides a solar roof installation including one or more of the solar roof components.

SUMMARY OF THE DRAWINGS

FIG. 4 is a perspective view of a solar roof component embodiment of the present invention, with the encapsulant not shown to illustrate the position of the photovoltaic array.

FIG. 5 is a perspective view of a solar roof component embodiment of the present invention, with the encapsulant shown, in which the outlines of the encapsulated photovoltaic cells are shown.

DETAILED DESCRIPTION WITH REFERENCE TO THE DRAWINGS

Figure 1:
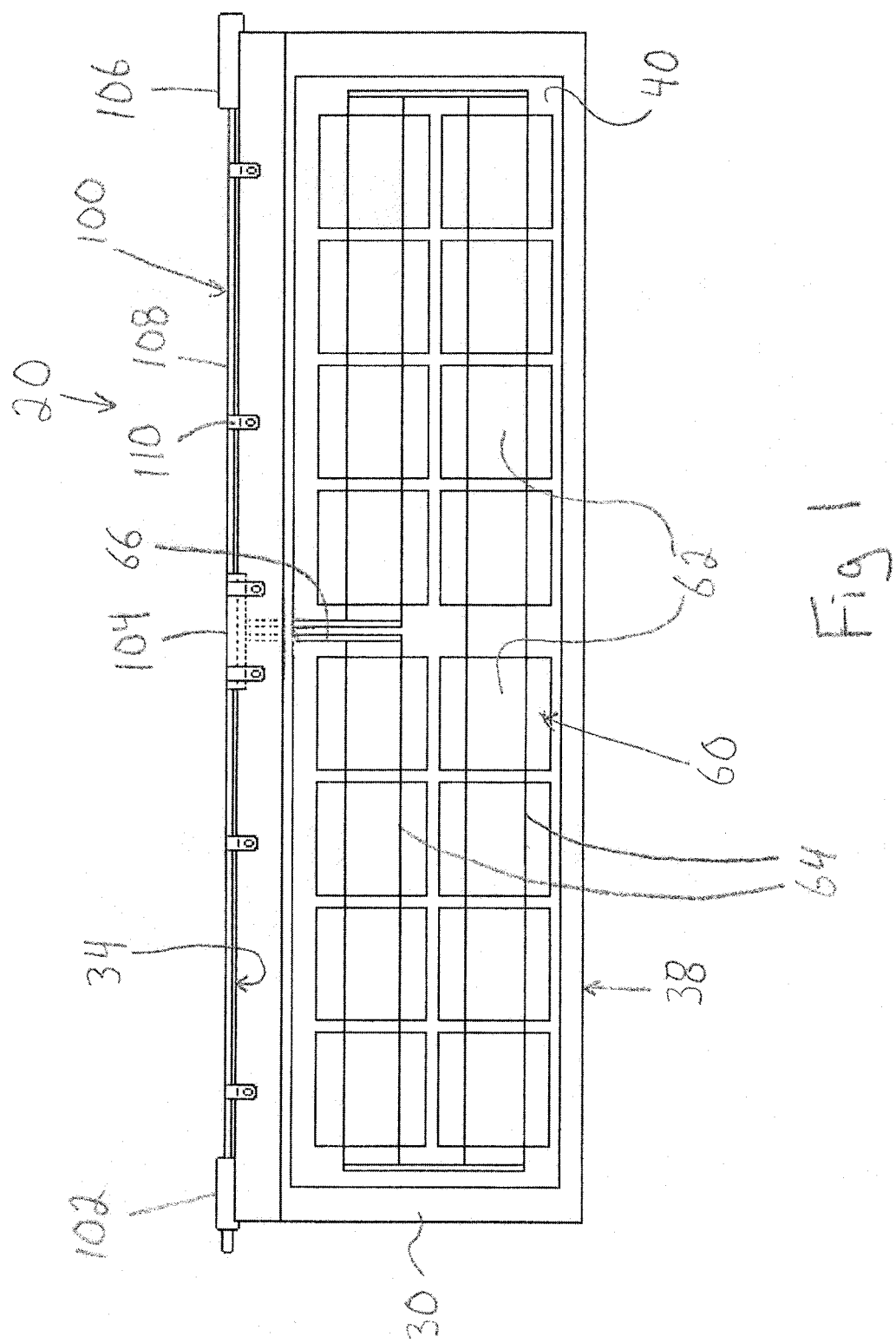
FIG. 1 is a top plan transparent view of a solar roof component embodiment of the present invention.
Figure 2:
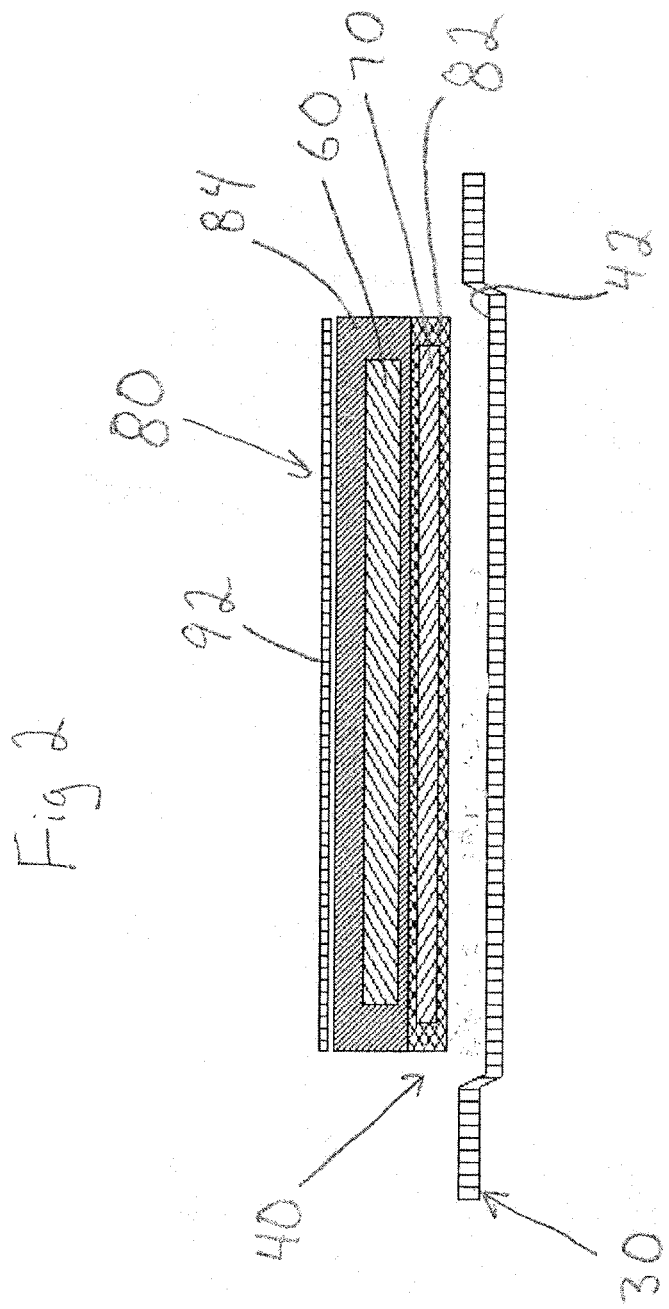
FIG. 2 is a schematic side sectional view of a portion of the solar roof component embodiment shown in FIG. 1.
Figure 3:
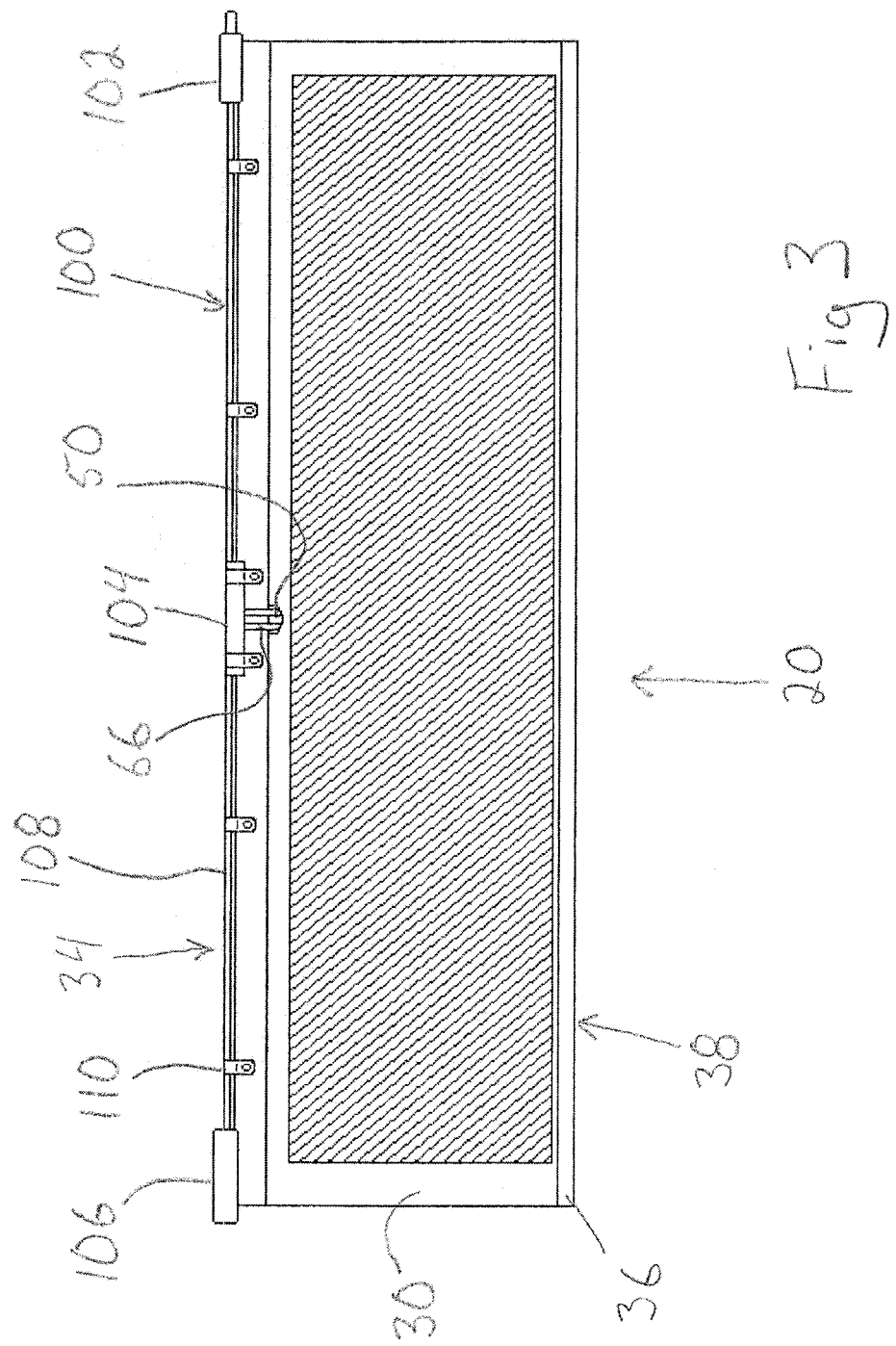
FIG. 3 is a bottom plan view of the solar roof component embodiment shown in FIG. 1.

A solar roof component embodiment of the present invention suitable for installation on a sloped roof, is shown in the drawings.

The solar roof component 20 includes: a formed sheetmetal roof panel 30 (preferably, having finished dimensions of about 4 ft by 1 ft) having an S-lock 32 along the edge intended to be the upper edge 34 when installed; a bottom lip 36 along the edge intended to be the lower edge 38 when installed, for mating with the S-lock of an adjacent similar panel; and a recess 40.

As shown in the drawings, the recess 40 has a generally rectangular planar recess bottom 42, two recess ends 44, an upper recess side 46 and a lower recess side 48. The upper recess side 46 has a wiring hole 50 therethrough, located mid-way along the length of the roof panel 30.

The recess 40 contains: a photovoltaic array 60 comprising: a plurality of photovoltaic cells 62 (in the embodiment shown in the drawings, the photovoltaic array 60 has sixteen photovoltaic cells 62), with the photovoltaic cells 62 interconnected one to another by array wires 64; connection wires 66 electrically connected to the photovoltaic array 60 and extending from the photovoltaic array 60 through the wiring hole 50; a barrier sheet 70 (preferably a fibreglass fabric; a suitable fibreglass fabric is as follows: Manufacturer of fibreglass fabric: Johns Manville—Product Name: Dura-Glass 7557—Description: non-woven glass fiber specialty mat) interposed between the photovoltaic array 60 and the recess bottom 42; and a translucent encapsulant 80, encapsulating the photovoltaic array 60 and the barrier sheet 70, the encapsulant 80 comprising a darker tinted layer 82, directly overlying the recess bottom 42 and substantially containing the barrier sheet 70, and a less tinted layer 84, overlying the darker tinted layer 82 and of sufficient thickness such that the top of the encapsulant 80 is at essentially the same level as the surrounding adjacent top of the roof panel 30.

The roof panel 30 is formed, and the exposed top surface of the encapsulant 80 is moulded or otherwise shaped, to mimic the appearance of wood shingles (commonly referred to as shakes). Such mimicry preferably involves imitating the gap between shingles by shallow channels 90, and imitating the shingle wood grain with a wood grain texture 92, comprising multiple irregular grooves and/or ridges extending generally between the upper edge 34 and the lower edge 38.

A wiring assembly 100 is connected to the photovoltaic array 60. The wiring assembly 100 is configured for electrically interconnecting the solar roof component 20 with other adjacent solar roof components 20 or to an ultimate discharge connection (i.e., the connection between a plurality of installed solar roof components 20 and the intended recipient of the electricity generated by same, e.g., batteries or an inverter). The wiring assembly 100 includes a male connector 102, a junction 104, a female connector 106 and assembly wires 108 interconnecting these components. The connection wires 66 are connected to the wiring assembly 100 at the junction 104. The junction 104 and portions of the assembly wires 108 are secured to the roof panel 30 with clips 110.

In the embodiments shown in the drawings, the means for electrically interconnecting one solar roof component 20 to another (i.e., the male connector 102 and female connector 106) are located at the ends of the solar roof component 20. It is understood that these locations will best facilitate installation in most roof configurations. However, the solar roof component 20 to solar roof component 20 electrical interconnections could be located elsewhere if desired.

Solar roof components 20 may be electrically interconnected in series or in parallel or in a combination of series and parallel connections, so as to achieve a desired voltage and amperage output for the collection of solar roof components 20 comprising a complete single installation. For example, a series connected domestic installation could be configured to provide an electrical output roughly in the range of 400-600 volts and a relatively low amperage (e.g., 5.25 amps).

Further details of the solar roof component 20 are disclosed in the following description of aspects of a method of manufacturing the solar roof component 20.

The roof panel 30 is preferably produced as follows:

1. obtain a 16" wide, 0.015 inch thick, pre-painted sheet metal panel, roll formed, cut to length and preferably permanently marked with a unique quality control number. The paint finish is preferably a high-performance, oven-cured, fluoropolymer surface protector, for example Durapon 70™ with DuPont™ Teflon®, preferably with ceramic infra-red reflective pigmentation added, manufactured by Dura Coat Products Inc. Alternatively, various other commonly available sheet metal coatings could be utilized;

2. press form the sheet metal panel to add the recess 40, channels 90 and wood grain texture 92;

3. create (preferably, punch) the wiring hole 50 (preferably a ½" hole); and 4. modify the sheet metal panel with a mechanical bender to create the S-lock 32 and bottom lip 36.

The photovoltaic array 60 is preferably produced by interconnecting in series sixteen crystalline solar cells with wires soldered thereto. Suitable crystalline solar cells are as follows: Manufacturer of solar cells: Everbright Solar Inc.—Model/Size: Mono Crystalline, 5"×5"—Open circuit voltage Voc: 0.604-0.623 V—Close circuit current Isc: 4.881-5.300 A—Max power voltage Vmax: 0.473-0.528 V—Max power current Imax: 4.429-4.924 A. Other 5"×5" crystalline solar cells and other sizes of solar cells could be used to achieve similar power results.

The solar roof component 20 is preferably produced as follows:

1. etch, clean and dry the recess to assist adhesion of subsequent materials. The etching is preferably accomplished by sand blasting. Alternatively, a chemical etching solution suitable for use with the paint finish could be used;
2. position the barrier sheet 70 in the recess 40;
3. pour a sufficient amount of a dark tinted liquid polymer encapsulant into the recess 40 to saturate and cover the barrier sheet 70, so as to form the darker tinted layer 82. The darker tinted layer 82 is preferably tinted dark enough to hide the barrier sheet 70. The encapsulant is preferably a UV-resistant optically clear liquid plastic, such as a rigid urethane casting resin. A preferred encapsulant product is as follows: Manufacturer of encapsulant product: Smooth-On, Inc., Product Name: Crystal Clear 200 (Part A & Part B). A suitable tint is offered by the same manufacturer and identified as "Brown Tint". With this encapsulant product and related tint, a suitable tinting ratio for the darker tinted layer 82 is 3 ml to 2.5 US gallons of Part B of the 2-part encapsulant product;
4. position the photovoltaic array 60 in the recess 40, i.e., on the barrier sheet 70 and the darker tinted layer 82; insert the connection wires 66 through the wiring hole 50; and apply a blocking means (perhaps a suitable adhesive tape) to the wiring hole 50 to prevent or at least impede, leakage of liquid encapsulant via the wiring hole 50;
5. pour a sufficient amount of a less tinted liquid polymer encapsulant into the recess 40, so as to bring the top of the less tinted liquid polymer encapsulant to the vicinity of the level of the top of the adjacent portions of the roof panel 30, thus covering and encapsulating the photovoltaic array 60 and portion of the connection wires 66 within the recess 40, and thereby ultimately forming the darker tinted layer 84. The less tinted liquid polymer encapsulant is preferably tinted sufficiently to obscure the photovoltaic array 60. With the preferred encapsulant product and tint identified above, a suitable tinting ratio for the less tinted liquid polymer encapsulant is 1.0 ml to 2.5 US gallons of Part B of the 2-part encapsulant product;
6. apply a reverse imprint mould to the surface of the less tinted liquid polymer encapsulant so as to create the channels 90 and wood grain texture 92 on the top surface of the less tinted layer 84. The reverse imprint mould is preferably a sheet metal form to which a suitable release agent has been applied.
7. once the encapsulant 80 has sufficiently cured, remove the reverse imprint mould; and
8. attach the connection wires 66 to the wiring assembly 100 at the junction 104 and attach the wiring assembly 100 to the roof panel 30 with the clips 110.

Quality control testing of the solar roof component 20 should include testing of the electrical components. It may be useful to test the photovoltaic array 60 and connection wires 66 prior to connection and installation of the wiring assembly 100. Testing after the photovoltaic array 60 is fully soldered together, re-testing after the photovoltaic array 60 is encapsulated and a third test of the photovoltaic array 60 after the wiring assembly 100 is connected, is preferred.

It is understood that the wood grain texture 92, and to a lesser extent the channels 90, on the encapsulant 80, enhance the electrical output of the photovoltaic array 60. The solar roof component 20 is preferably installed on the portion of a roof most exposed to direct sunlight (e.g., in the northern hemisphere, on the south side of a roof having a ridge running east-west). However, during each day, as the sun appears to pass across the sky, there will typically only be a limited period of time, perhaps only a few hours, during which the sun and roof surface are at the best relative orientation for generating electricity. By contrast, at other times, typically in the morning and evening, the sun's rays will meet the general plane defined by the roof surface, from the side at a relatively small angle. When the sun's rays meet a smooth surface (albeit translucent or transparent) at such a relatively small angle, a significant portion of the radiation is reflected away. By contrast, it is understood that the ridges and grooves of the wood grain texture 92 reduce this reflection loss, in that a ridged or grooved surface provides a plurality of longitudinally extending surface portions oriented to meet the solar radiation coming from the side at a larger angle than if the surface were smooth, thereby reducing reflective losses. It is understood that such ridges and grooves will, within a range of orientations relative to the seasonal and daily passage of the sun in the sky, provide a net increase in solar panel efficiency, by reducing reflective losses when the sun is at one or the other side, while not at all (or only minimally) impairing solar panel efficiency when the sun's rays are meeting the roof more directly.

A woodgrain imprint enhances solar cell efficiency as outlined above. However, it is understood that different scales of ridges and grooves, in particular a finer texturing finish along with the woodgrain imprint, would further enhance solar cell efficiency. Such a fine-texture woodgrain imprint combination may be obtained by using a reverse mould made from sheet metal that had been roll formed to have an overall fine embossed texture then press stamped with the woodgrain effect. This extra texture is understood to have an additive effect with the woodgrain imprint on the solar cell efficiency.

Preferably, the solar roof component 20 is configured to interlock with known non-solar metal roof panels. The solar roof component 20 may be manufactured with exterior dimensions and design features that are for functional purposes, identical to those of known non-solar metal roof panels, such that the solar roof component 20 may be installed in combination with such known non-solar metal roof panels. Further the tinting of the encapsulant 80 outlined above permits a relatively good colour match between the encapsulant 80 and the paint finish of the roof panel 30, and thus permits a relatively good colour match between the solar roof component 20 and known non-solar roof panels. The reverse imprint moulding of the encapsulant 80 also adds to the visual similarity between the solar roof component 20 and some known non-solar roof panels. Thus, the solar roof component 20 may be configured to provide a relatively good visual match with the known non-solar metal roof panels, thus permitting roof installations having both solar and non-solar roof panels, with each located to facilitate installation and optimize electrical production relative to initial capital cost.

The solar roof component 20 has more components and is more complicated than a non-solar metal roof panel, and thus the solar roof component 20 is more expensive to manufacture than a non-solar metal roof panel. It would be unusual to use only solar panels to cover a typical residential roof. For an average home, it is generally not practical or cost effective to cover the entire roof with solar roof panels. Usually, only a minority of panels on a roof would be solar panels. Only the portions of the roof that are uninterrupted (i.e., not interrupted by a valley, chimney, vent, dormer, etc.) and suitably facing the sun would be optimal locations for solar panels.

Known solar roof components are typically very visually obvious due to their difference in colour, size, shape and surface texture from the adjacent non-solar roof components.

Some homeowners are resistant to installing the known solar roof components because of their unconventional appearance which they perceive to be unattractive. By contrast, the invention described herein allows for the solar roof component 20 to act as the primary roof covering and as photovoltaic panels, and to truly blend in (being sufficiently similar in colour, size and shape) with adjacent non-solar roof coverings.

The efficiency of conventional solar cells declines as temperature increases. As installations for solar cells are desirably configured to absorb, the sun's rays, in use, when the sun is shining, a solar cell is typically at a higher temperature than adjacent components. In the current invention, the sheet metal from which the solar roof component 20 is made, has a relatively high thermal conductivity, particularly when compared to conventional shingle materials, (e.g., wood, slate, asbestos-cement, bitumen-soaked paper covered with aggregate (asphalt shingle), composite and ceramic), and thus is generally a superior material for conducting heat from the solar cells.

As with the known metal roof panels, the solar roof component 20 described herein is configured so that, when installed, there is a void between the underside of the solar roof component 20 and the underlying roof material (typically plywood or dimensional lumber) to which the solar roof component 20 is attached. Thus, a roof with multiple solar roof components 20 may be self venting (and thus, to a certain extent, self cooling), in that air may be free to flow between the solar roof components 20 and the underlying roof material, as induced by convection.

The self venting effect may be augmented by the installation of a thermostatically controlled fan or fans configured to draw cooler air into the void between the solar roof component 20 and the underlying roof material. Such fans may be associated with or directly connected to ducting extending to a location or locations expected or known to have cooler air than that in the vicinity of the solar roof components 20. For example, with the solar roof components 20 installed on the south facing portion of a roof (in the northern hemisphere), ducting could be used to draw air from under the eaves on the northern side of the structure. Alternatively or additionally, air conditioning units may be used to cool the void between the solar roof component 20 and the underlying roof material.

The solar roof components 20 may be configured so that when installed they define an air passage or passages configured to augment self venting and/or assisted cooling (i.e., assisted by way of a fan or fans and/or air conditioning units).

What is claimed is:

1. A solar roof component for use on a sloped roof, the component comprising:
    a sheet metal roof panel having an upper edge and a lower edge configured for interlocking with other similar panels, and having a panel top surface and a recess in the top surface having a recess bottom, wherein the recess bottom is generally planar;
    one or more solar cells located in the recess and encapsulated in a light transmitting encapsulant affixed to the recess wherein the encapsulant top surface generally aligns with the panel top surface wherein the panel top surface and encapsulant top surface have channels extending generally between the upper edge and the lower edge in appearance mimicking the gaps between adjacent wood shingles, and ridges and grooves extending generally between the upper edge and the lower edge in appearance mimicking the surface texture of a wood shingle;
    a wiring assembly, connected to the array of solar cells and comprising a first electrical connector and a second electrical connector, the first electrical connector configured to electrically connect with a connector similar to the second connector on another similar solar roof component, and the second electrical connector configured to electrically connect with a connector similar to the first connector on still another similar roof component; and
    a barrier sheet interposed between the recess bottom and the one or more solar cells
    wherein the encapsulant comprises two layers, being a darker tinted layer overlying the recess bottom and substantially encapsulating the barrier sheet, and a less tinted layer overlying the darker tinted layer and substantially encapsulating the one or more solar cells; and
    wherein, a plurality of such solar roof components are installable on a roof in an electrically interconnected manner.

2. The solar roof component of claim 1, wherein the encapsulant comprises a UV-resistant optically clear plastic.

3. The solar roof component of claim 2, wherein the plastic is a urethane casting resin.

4. The solar roof component of claim 1, wherein the barrier sheet is a non-woven glass fiber mat.

5. The solar roof component of claim 1, wherein the one or more solar cells are a photovoltaic array comprising sixteen crystalline solar cells and wires electrically interconnecting the solar cells in series.

6. The solar roof component of claim 1, wherein the upper edge has an interlocking configuration and the lower edge has a bottom lip configured for engaging the interlocking configuration of the upper edge of a similar adjacent panel so as to form a water shedding interlocking joint between the solar roof component and the adjacent panel.

7. The solar roof component of claim 1, wherein the roof panel is coated with an oven-cured, fluoropolymer surface protector.

8. A solar roof installation comprising one or more solar roof components according to claim 1.

* * * * *